United States Patent
Moscaluk et al.

(10) Patent No.: US 9,608,615 B2
(45) Date of Patent: Mar. 28, 2017

(54) NEGATIVE HIGH VOLTAGE HOT SWITCHING CIRCUIT

(71) Applicant: Cypress Semiconductor Corporation, San Jose, CA (US)

(72) Inventors: Gary Peter Moscaluk, Colorado Springs, CO (US); Bogdan I. Georgescu, Colorado Springs, CO (US); Timothy Williams, Bellevue, WA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/965,678

(22) Filed: Dec. 10, 2015

(65) Prior Publication Data

US 2016/0365849 A1    Dec. 15, 2016

Related U.S. Application Data

(60) Provisional application No. 62/174,751, filed on Jun. 12, 2015.

(51) Int. Cl.
| | | |
|---|---|---|
| *G11C 16/00* | (2006.01) | |
| *H03K 17/0412* | (2006.01) | |
| *G11C 17/08* | (2006.01) | |
| *G11C 11/417* | (2006.01) | |
| *G11C 16/30* | (2006.01) | |
| *G11C 11/22* | (2006.01) | |
| *H03K 19/0185* | (2006.01) | |

(52) U.S. Cl.
CPC .... *H03K 17/04123* (2013.01); *G11C 11/2297* (2013.01); *G11C 11/417* (2013.01); *G11C 16/30* (2013.01); *G11C 17/08* (2013.01); *H03K 19/018507* (2013.01)

(58) Field of Classification Search
CPC ... G11C 16/30; G11C 11/417; G11C 11/2297; H03K 17/04123; H03K 19/018507
USPC .................. 365/185.29, 189.09, 189.11, 226
See application file for complete search history.

(56) References Cited

U.S. PATENT DOCUMENTS

| | | | |
|---|---|---|---|
| 5,400,279 A | * | 3/1995 | Momodomi ........... G11C 16/08 365/185.09 |
| 5,919,253 A | | 7/1999 | Schneider |

(Continued)

FOREIGN PATENT DOCUMENTS

CN    1452077    10/2003

OTHER PUBLICATIONS

On Semiconductor, "High Voltage, High and Low Side Driver" Semiconductor Components Industries, LLC, Nov. 2014, 18 pages.

(Continued)

*Primary Examiner* — Tan T Nguyen

(57) ABSTRACT

A biasing circuit includes cascoded transistors including a first transistor and a second transistor. A first gate of the first transistor is coupled to a second gate of the second transistor at a first node. The circuit also includes a voltage control circuit coupled to at least one of the first transistor or the second transistor. The voltage control circuit is configured to change a voltage level of at least one of the first transistor or the second transistor to allow voltage domain transition of an output signal in view of a change in state of an input signal without ramping a supply signal of the biasing circuit.

18 Claims, 6 Drawing Sheets

(56) References Cited

U.S. PATENT DOCUMENTS

| | | | | |
|---|---|---|---|---|
| 7,126,869 | B1 * | 10/2006 | Chou | G11C 7/067 365/203 |
| 7,671,657 | B1 * | 3/2010 | Chen | H03K 19/018521 326/68 |
| 7,692,474 | B2 | 4/2010 | Stegmayr | |
| 7,782,113 | B2 * | 8/2010 | Lin | H03K 19/018521 326/80 |
| 8,542,056 | B2 | 9/2013 | Rossi et al. | |
| 9,041,472 | B2 | 5/2015 | Chen et al. | |
| 2006/0267414 | A1 | 11/2006 | Han et al. | |
| 2007/0206427 | A1 * | 9/2007 | Hirobe | G11O 5/147 365/189.09 |
| 2009/0153067 | A1 | 6/2009 | Nerone | |
| 2012/0182060 | A1 | 7/2012 | Rana | |
| 2013/0099755 | A1 | 4/2013 | Lei | |
| 2014/0204689 | A1 * | 7/2014 | Kim | G11C 7/1057 365/189.14 |
| 2014/0369136 | A1 | 12/2014 | Hirose et al. | |

OTHER PUBLICATIONS

Maroldt, "Gallium Nitride Based Transistors for High-Efficiency Microwave Switch-Mode Amplifiers", Dipl.-Ing., Jun. 2010, 177 pages.
Search Report for "Negative High Voltage Hot Swiching Circuit", dated Oct. 2015, 11 pages.
International Search Report for International Application No. PCT/US16/19049 dated May 11, 2016; 2 pages.
Written Opinion of the International Searching Authority for International Application No. PCT/US16/19049 dated May 11, 2016; 4 pages.

* cited by examiner

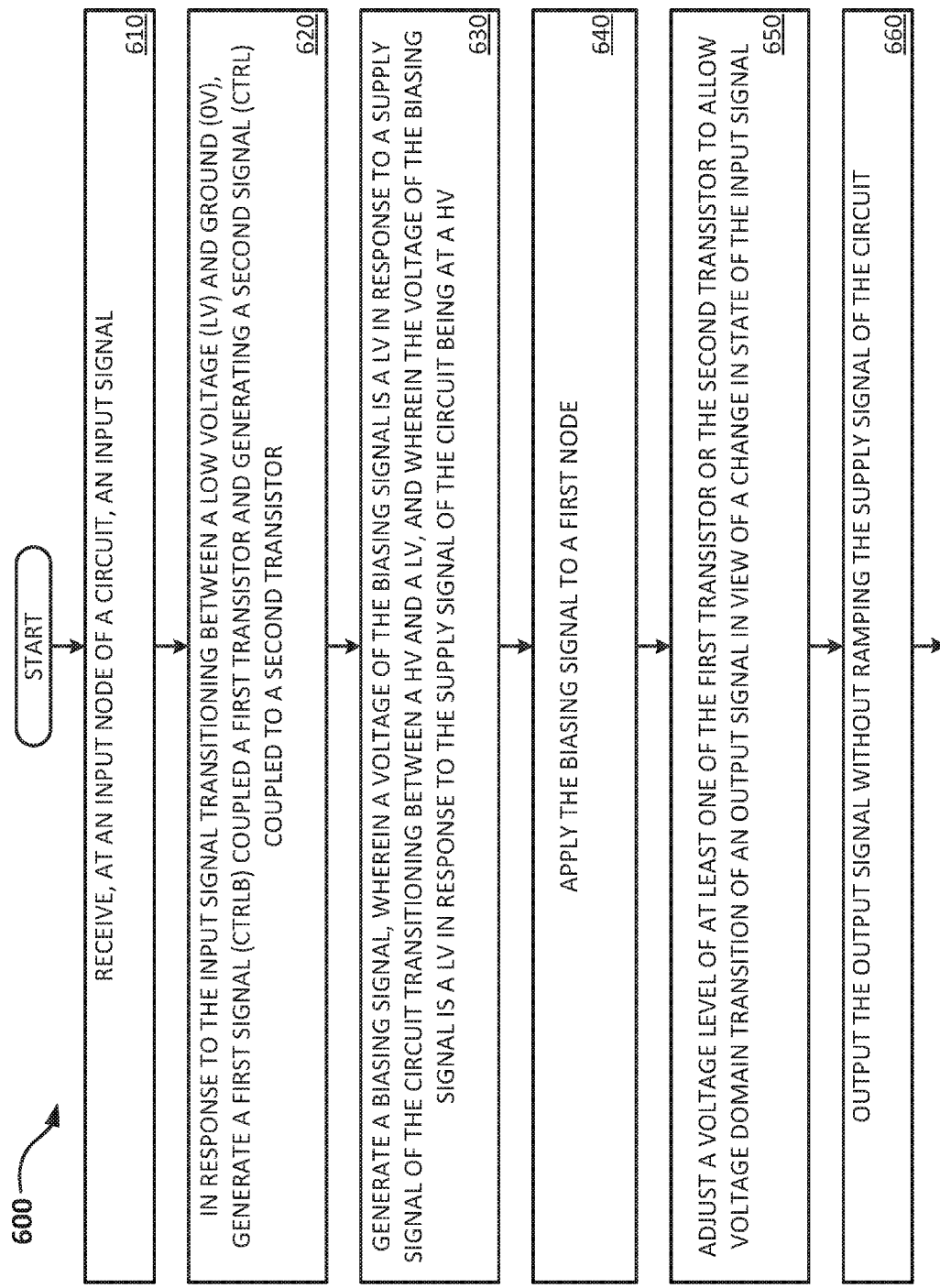

NEGATIVE HIGH VOLTAGE HOT SWITCHING CIRCUIT

RELATED APPLICATIONS

This application claims the benefit of U.S. Provisional Application No. 62/174,751, filed on Jun. 12, 2015, the content of which is hereby incorporated by reference herein.

BACKGROUND

Hot switching circuitry may be utilized by devices requiring voltage level shifting without positive and/or negative supplies of a level shifter changing to obtain a change in the output state of the level shifter. When a device has to transition modes (i.e., switch between active and standby modes), hot switching circuitry may allow current to quickly flow through various components in the circuitry, as an existing voltage may already be present within the device when the device is transitioning from one mode to another. Therefore, hot switching may allow a device to quickly transition from one voltage level to another when switching from one mode to another.

BRIEF DESCRIPTION OF THE DRAWINGS

The present disclosure is illustrated by way of example, and not by way of limitation, in the figures of the accompanying drawings.

FIG. 6 is a flow diagram of a biasing signal used in a hot switching circuit, according to an embodiment.

DETAILED DESCRIPTION

Figure 1:
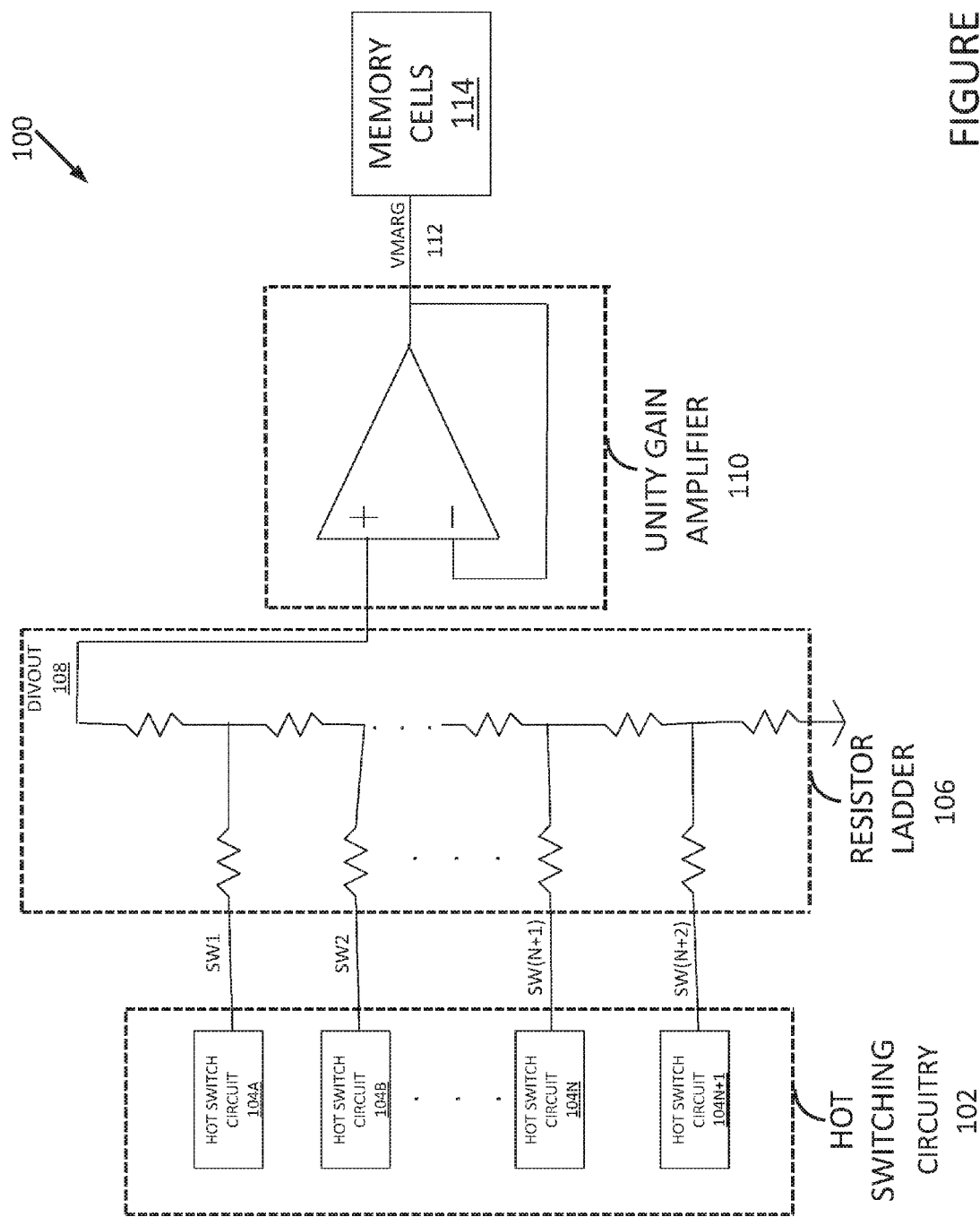
FIG. 1 is a block diagram illustrating a circuit system for a memory, according to an embodiment.

Hot switching circuitry may provide for an output voltage signal to switch or transition between different power domain levels, without ramping an internal voltage supply signal, by changing an input state of the hot switching circuit. The output voltage signal may switch from one power domain to another power domain. Signals in one power domain may be low voltage (LV) signals, while signals in a different power domain may be high voltage (HV) signals. Therefore, the output voltage signal may transition between HV and LV. The transition between HV and LV may also be referred to as voltage domain transition.

Hot switching circuits may implement native devices. A native device is a zero threshold voltage device which may be used for cascoding and may provide over-voltage protection in HV circuits. One type of a native device is a native transistor.

Native devices may be N-channel metal oxide semiconductor field-effect transistors (nMOSFET), also referred to as NMOS. To maintain a safe operating area (SOA) of the native transistor, NMOS high voltage or "NHV" native transistors may be cascoded.

A native device such as a native transistor includes an extra mask which may be added during manufacturing of the native transistor. The addition of the extra mask may lead to additional manufacturing time and/or increased manufacturing costs. Using native transistors in circuits may provide solutions to over-voltage stress requirements of a circuit. However, due to the extra manufacturing costs of the extra mask, native transistors may not be implemented within hot switching circuits due to cost constraints.

The embodiments described herein are directed to a hot switching circuit implemented wherein native transistors may not be required. The embodiments of the hot switching circuits may ensure that no over-voltage stress issues exist within the hot switching circuit.

In an embodiment, a hot switching circuit includes a biasing circuit. The biasing circuit includes cascoded transistors including a first transistor and a second transistor. A first gate of the first transistor is coupled to a second gate of the second transistor at a first node. The biasing circuit also includes a voltage control circuit coupled to at least one of the first transistor or the second transistor. The voltage control circuit is configured to change a voltage level of at least one of the first transistor or the second transistor to allow voltage domain transition of an output signal in view of a change in state of an input signal without ramping a supply signal of the biasing circuit.

In an embodiment, the hot switching also includes a bulk controller coupled to a second node. The bulk controller is configured to output a bulk signal via the second node. The hot switching also includes a third transistor including a gate, a well, a source, and a drain. The well of the third transistor is coupled to the second node, and the well is configured to receive the bulk signal via the second node. The hot switching also includes a third node configured to output an output signal at the output of the circuit. The hot switching also includes a first inverter coupled to a fourth node. The fourth node is configured to receive, at an input of the first inverter, the input signal of the circuit.

FIG. 1 is a block diagram illustrating a circuit system for a memory 100, according to an embodiment. The circuit system for the memory 100 includes hot switching circuitry 102. Hot switching circuitry 102 provides a fast output transition time to devices (e.g., memory 100) when devices transition between HV and LV (i.e., voltage domain transition). The circuit system for the memory 100 further includes a resistor ladder 106, a unity gain amplifier 110, and memory cells 114. The hot switching circuitry 102 may include multiple hot switch circuits. In the depicted embodiment, the hot switching circuits includes hot switching circuit 104A, hot switching circuit 104B, . . . , hot switching circuit 104N, and hot switching circuit 104N+1. A greater or fewer numbers of hot switching circuits than depicted may be included in the hot switching circuitry 102. Hereinafter, one or more of the hot switching circuits may be referred to as a hot switch circuit 104. A hot switch circuit 104 may be one of the hot switch circuits depicted herein in FIGS. 2-4.

Each hot switch circuit 104 may be coupled to resistors included in the resistor ladder 106. In the embodiment shown in FIG. 1, hot switch circuit 104A is coupled to the resistor ladder 106 via bus SW1; hot switch circuit 104B is coupled to the resistor ladder 106 via bus SW2; hot switch circuit 104N is coupled to the resistor ladder 106 via bus SW(N+1); hot switch circuit 104N+1 is coupled to the resistor ladder 106 via bus SW(N+2).

The resistor ladder 106 includes resistor ladder circuitry that is coupled to each hot switch circuit 104 via a bus. Each resistor ladder circuitry generates an analog voltage (the analog voltage may range between −2.5V to 2.5V, for example, based on a digital to analog converter (DAC) setting of resistor ladder circuitry by changing analog circuits in 100 millivolts). The resistor ladder 106 includes a node called DIVOUT 108. The combined analog voltage of the resistor ladder 104 is carried via the DIVOUT node 108.

The DIVOUT node 108 carries an output signal to a positive input of the unity gain amplifier 110. The output of the unity gain amplifier 110 is coupled to a node called VMARG 112. The output is fed-back into a negative input of the unity gain amplifier 110. The VMARG node 112 is coupled to an input of the memory cells 114.

It will be appreciated by those skilled in the art that the memory cells 114 have been simplified for the purpose of illustration, and not intended to be a complete description. The memory cells 114 may be coupled to all, some, or more components than illustrated in FIG. 1. The memory cells 114 may be non-volatile memory (NVM) cells included in an NVM device. Additionally, an NVM memory device may include all, some, or more components than illustrated in FIG. 1.

Various operations may be performed on the memory cells 114 (e.g., erase, program, and read operations). Each of the memory cells 114 may also be compatible with Fowler-Nordheim programming techniques.

In one embodiment, each of the memory cells 114 may be a two transistor (2T) memory cell. In a 2T memory cell, one transistor may be a memory transistor, while another transistor may be a pass transistor. In other implementations, such as where the memory cells 114 are NVM cells, the NVM cell may include other types of transistors, such as a single memory transistor (1T).

In an embodiment, hot switch circuits are also referred to as hot switching circuits. Hot switching circuits may be used by a memory device to provide output signals to memory cells within the memory device. The memory device may be an NVM device that is used for storage in electronic systems. An NVM device permits the retention of information when electrical power is not available. NVM devices may include, for example, read-only-memory (ROM), programmable-read-only memory (PROM), erasable-programmable-read-only memory (EPROM), electrically-erasable-programmable-read-only-memory (EEPROM) devices, FLASH cell memory, non-volatile Static RAM (nvSRAM), Ferro Electric Random Access Memory (FRAM). Some memory devices utilize transistors and gate structures which may include a memory element or charge storage layer. The charge storage layer may be programmed to store data based on voltages applied to or received by a memory array of the memory device. The voltages may be applied by level shifters. In an embodiment, the memory array may be a silicon oxide nitride oxide silicon (SONOS) type memory array.

Figure 2:
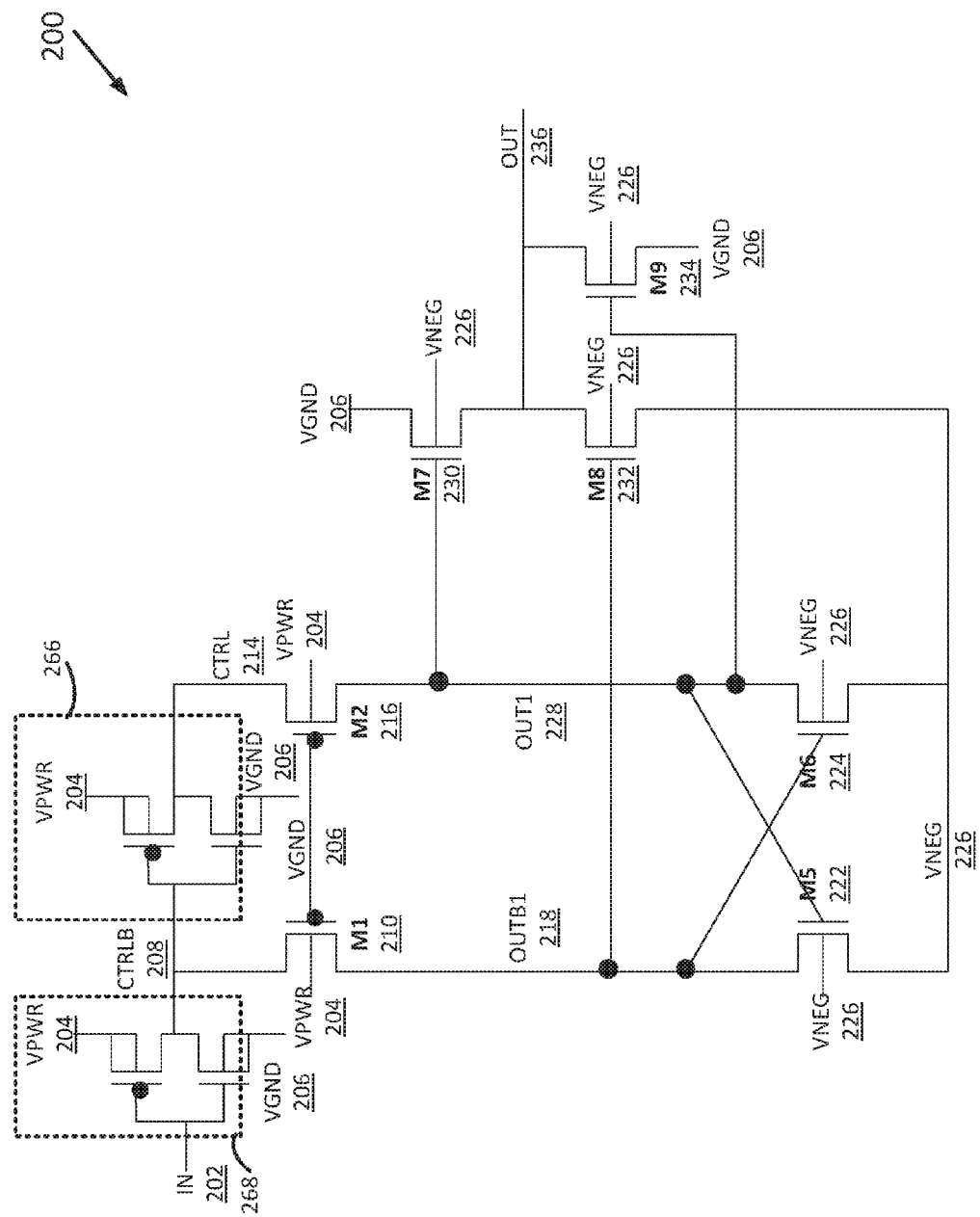
FIG. 2 illustrates a hot switching circuit, according to one embodiment.
Figure 3:
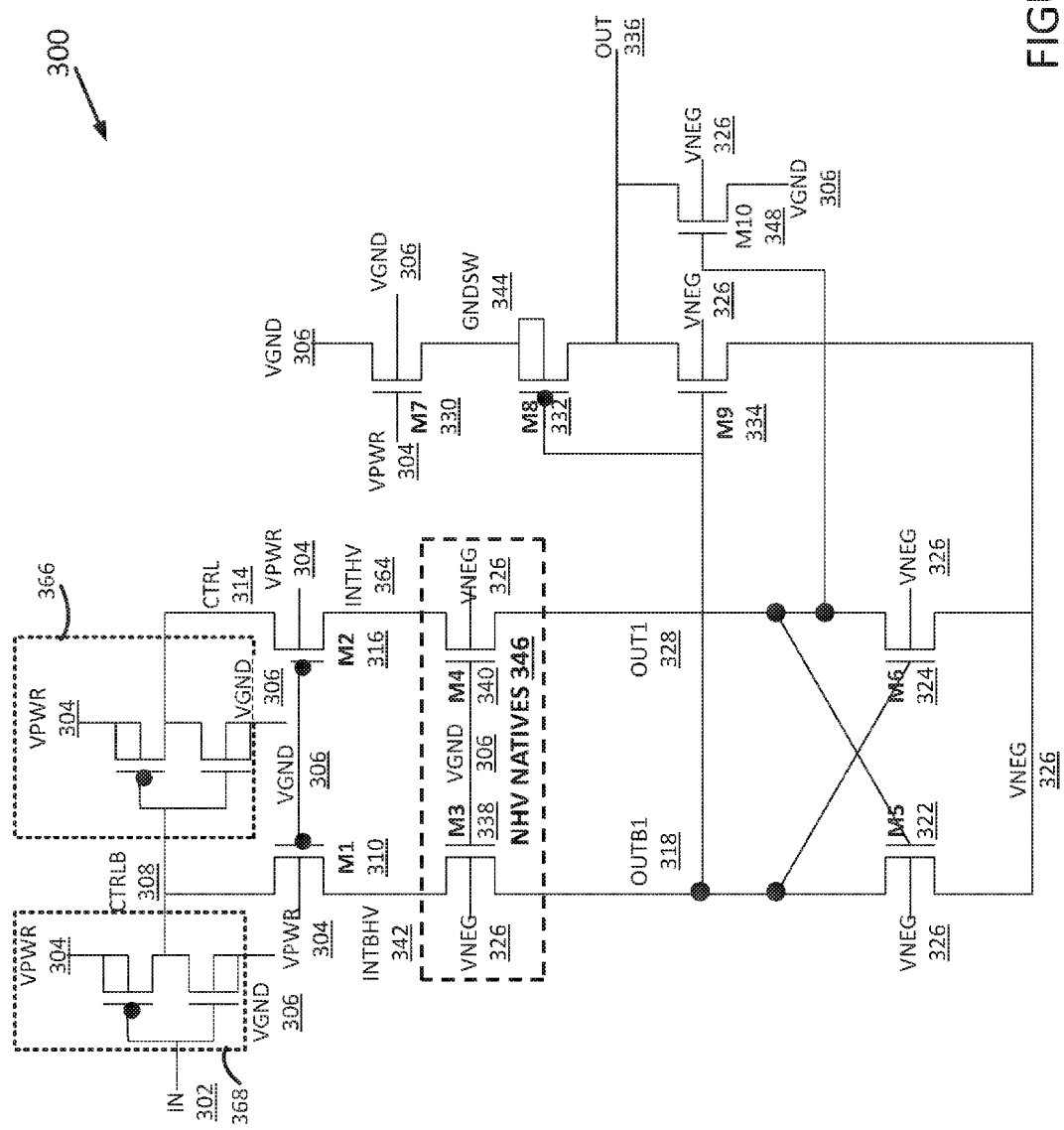
FIG. 3 illustrates a hot switching circuit, according to another embodiment.
Figure 4:
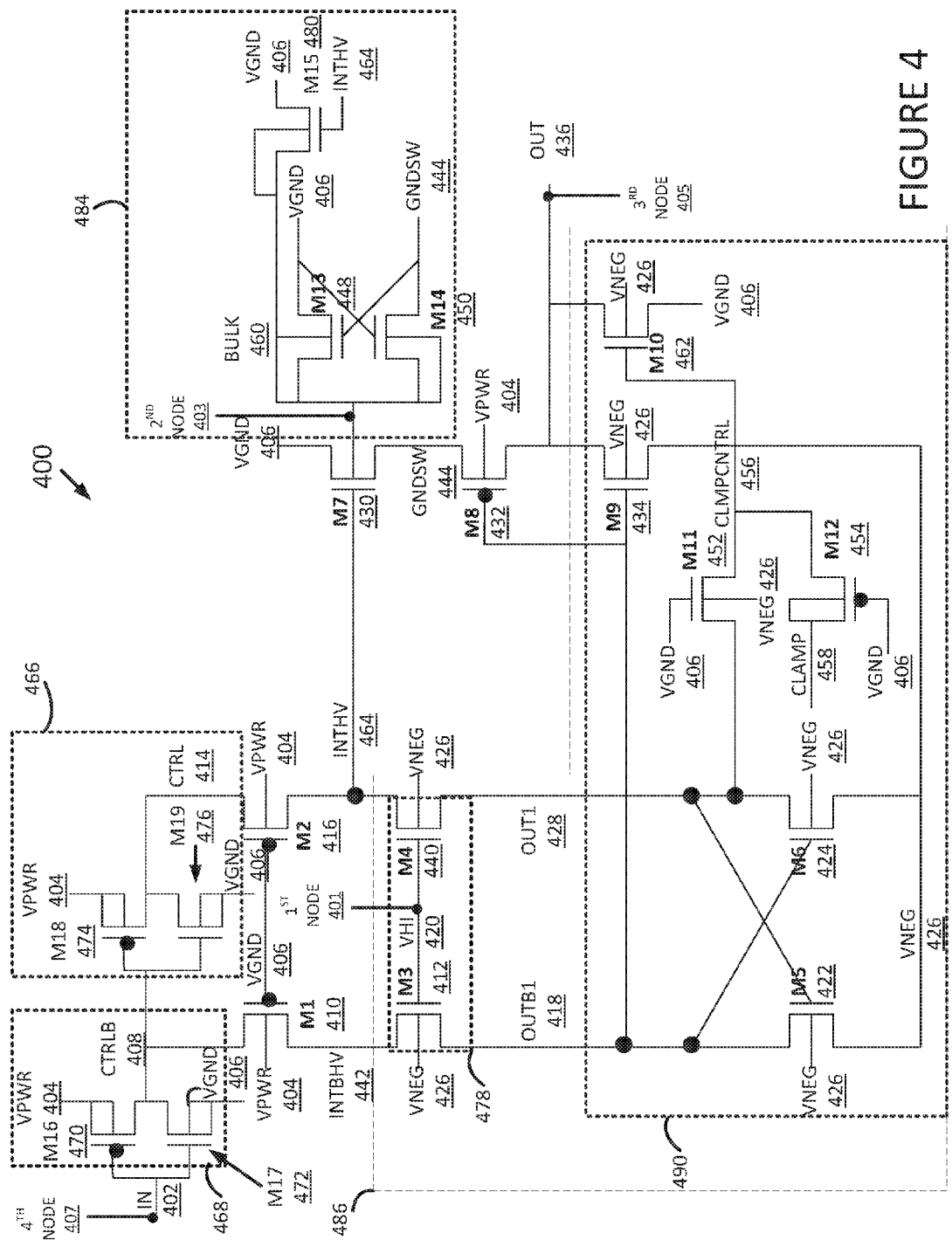
FIG. 4 illustrates a hot switching circuit, according to another embodiment.

Although the same reference numerals may be assigned to different signals in FIGS. 2-4, the signals may be input by different sources. For example, in FIG. 2, the VPWR signal is represented by reference numeral 204. The VPWR signal 204 may be supplied by one or more sources and is not limited to being supplied by a single source.

The ground potential, VGND, depicted in FIGS. 2-4 is at 0V. The terms ground potential, ground and/or 0V are used interchangeably herein.

The hot switch circuits described in FIGS. 2-4 include multiple transistors. The transistors may be 4-terminal transistors including a gate, source, drain, and well (or bulk). The transistors may be pass transistors or memory transistors. Pass transistors may be N-channel metal oxide semiconductor field-effect transistors (nMOSFET).

The transistors in FIGS. 2-4 may include charge trapping memory transistors. Memory transistors have a shaded oxide layer as the gate. The safe operating area (SOA) of memory transistors is typically much higher than other transistors in a memory array and is not often of great concern to designers. The pass transistors may be of a lower SOA than the memory transistors.

FIG. 2 illustrates a hot switching circuit 200, according to one embodiment. The hot switching circuit 200 is coupled to receive an input (IN) signal 202 at an input node. The hot switching circuit 200 is also coupled to receive a voltage power (VPWR) signal 204, a voltage ground (VGND) signal 206, and a voltage negative (VNEG) signal 226. The hot switching circuit 200 includes a transistor (M1) 210, a first inverter 268, a second inverter 266, a transistor (M2) 216, a transistor (M5) 222, a transistor (M6) 224, a transistor (M7) 230, a transistor (M8) 232, a transistor (M9) 234. The hot switching circuit 200 is coupled to output an output (OUT) signal 236 at an output node of the hot switching circuit 200. The hot switching circuit 200 generates a control bar (CTRLB) signal 208, a control (CTRL) signal 214, an internal output bar (OUTB1) signal 218, and an internal output (OUT1) signal 228, In the depicted embodiment, the first inverter 268 and the second inverter 266 each includes a pair of NMOS and PMOS transistors. The transistors (M5) 222, (M6) 224, (M7) 230, (M8) 232, and (M9) 234 of the hot switching circuit 200 are NMOS transistors. The transistors (M1) 210 and (M2) 216 of the hot switching circuit 200 are PMOS transistors.

The transistors (M5) 222 and (M6) 224 are cross-coupled NMOS devices that use positive feedback to provide level shifting for the hot switching circuit 200.

When the voltage of the VNEG signal 226 is at a HV (e.g., −3V), the OUT signal 236 will transition from VNEG to ground (i.e., 0 Volts or 0V). The transistors (M7) 230 and (M8) 232 may pull the OUT signal 236 to either VNEG or ground (0V). The first inverter 268 and the second inverter 266 that output CTRLB 208 and CTRL 214 to the sources of the transistors (M1) 210 and (M2) 216 may have a voltage of either ground or VPWR, respectively. VPWR may be at 1.2V. The voltage of the OUTB1 signal 218 and OUT1 signal 228 may also be 1.2V. The drain of the transistor (M6) 224 will be coupled to receive 1.2V. The source of the transistor (M6) is coupled to receive the VNEG signal 226. If VNEG is at −3V, the hot switching circuit 200 may eventually fail due to an over-voltage condition across the drain to source of transistors M5 and M6 in the hot switching circuit 200.

FIG. 3 illustrates a hot switching circuit 300, according to another embodiment. The hot switching circuit 300 is coupled to receive an input (IN) signal 302 at an input node. The hot switching circuit 300 is also coupled to receive a voltage power (VPWR) signal 304, a voltage ground (VGND) signal 306, a voltage negative (VNEG) signal 326, and a ground switch (GNDSW) signal 344. The hot switching circuit 300 includes a transistor (M1) 310, a transistor (M3) 338, a transistor (M4) 340, a first inverter 368, a second inverter 366, a transistor (M2) 316, a transistor (M5) 322, a transistor (M6) 324, a transistor (M7) 330, a transistor (M8) 332, a transistor (M9) 334, and a transistor (M10) 348. The hot switching circuit 300 generates a control bar (CTRLB) signal 308, a control (CTRL) signal 314, an internal output (OUT1) signal 328, an internal output bar (OUTB1) signal 318, an internal bar HV (INTBHV) signal 342, and an internal HV (INTHV) signal 364. The hot switching circuit 300 is coupled to output an output (OUT) signal 336 of the hot switching circuit 300 at an output node.

The transistors (M3) 338 and (M4) 340 combined together form the negative high voltage (NHV) natives 346.

In the depicted embodiment, both the first inverter 368 and the second inverter 366 include a pair of NMOS and PMOS transistors. The transistors (M3) 338, (M4) 340, (M5) 322, (M6) 324, (M7) 330, (M9) 334, and (M10) 348 of the hot switching circuit 300 are NMOS transistors. The transistors (M1) 310, (M2) 316 and (M8) 332 of the hot switching circuit 300 are PMOS transistors.

The NHV natives 346 include cascode devices (the transistors (M3) 338 and (M4) 340) that may protect the cross-coupled HV NMOS devices from over-voltage stress. The NHV natives 346 are zero threshold voltage transistors and utilize static biasing for the cascodes. The gates of the transistors (M3) 338 and (M4) 430 are both coupled to the VGND signal 306 (and are thus coupled to ground). Therefore, the maximum voltage of the OUT1 signal 328 is 0V and the maximum voltage of the OUTB1 signal 318 is −3V. This voltage differential may not create a stress across the transistors (M5) 322 and (M6) 324.

The NHV natives 346 may require an extra mask (including one or more additional layers) during the manufacturing of the transistors (M3) 338 and (M4) 340. The terms NHV natives and is used herein to describe NHV native transistors or native transistors. The extra mask is added to create zero threshold voltage devices which may be used for cascoding and may provide over-voltage protection in HV circuits. The extra mask in the NHV natives 346 may result in additional manufacturing costs and/or production time.

Using NHV natives 346 in circuits may provide a solution to avoid over-voltage stress requirements of a circuit. However, due to the extra manufacturing costs of the extra mask, NHV natives may not be implemented within hot switching circuits due to cost constraints.

FIG. 4 illustrates a hot switching circuit 400, according to another embodiment. The hot switching circuit 400 is coupled to receive an input (IN) signal 402 at an input node (i.e., a fourth node 407). The hot switching circuit 400 is also coupled to receive a voltage power (VPWR) signal 404, a voltage ground (VGND) signal 406, and a voltage negative (VNEG) signal 426. The hot switching circuit 400 includes a transistor (M1) 410, a transistor (M3) 412, a transistor (M2) 416, a transistor (M5) 422, a transistor (M6) 424, a transistor (M7) 430, a transistor (M8) 432, a transistor (M9) 434, a transistor (M10) 438, a transistor (M4) 440, a transistor (M13) 448, a transistor (M14) 450, a transistor (M15) 480, a transistor (M11) 452, a transistor (M12) 454, a transistor (M10) 462, a transistor (M16) 470, a transistor (M17) 472, a transistor (M18) 474), and a transistor (M19) 476. The hot switching circuit 400 generates a control bar (CTRLB) signal 408, a control (CTRL) signal 414, a voltage high voltage (VHI) signal 420, an internal output (OUT1) signal 428, an internal output bar (OUTB1) signal 418, an internal bar HV (INTBHV) signal 442, a ground switch (GNDSW) signal 444, a clamp control (CLMPCNTRL) signal 456, a clamp (CLAMP) signal 458, a bulk (BULK) signal 460, and an internal HV (INTHV) signal 464. The hot switching circuit 400 is coupled to output an output (OUT) signal 436 at an output node (i.e., a third node 405) of the hot switching circuit 400.

The signals depicted in FIG. 4 may be carried on various nodes. The VHI signal 420 is carried on a first node 401. The BULK signal 460 is carried on a second node 403. The OUT signal 436 is carried on a third node 405 (also referred to as an output node). The IN signal 402 is received by and carried on a fourth node 407 (also referred to as an input node).

Cascoded transistors 478 in FIG. 4 includes the cascoded transistors (M3) 412 and (M4) 440. In the depicted embodiment, cascoded transistors 478 are included within a biasing circuit 486. Alternatively, the cascoded transistors 478 may not be included within biasing circuit 486. The biasing circuit 486 also includes a voltage control circuit 490. The voltage control circuit 490 is coupled to the cascoded transistors 478. The voltage control circuit 490 includes cross-coupled transistors (M5) 422 and (M6) 424 and clamp control circuitry. The clamp control circuitry includes the transistors (M12) 454, (M11) 452, (M9) 434, and (M10) 426. The biasing circuit 486 may change a voltage level of cascoded transistors (M3) 412 and/or (M4) 440 to allow voltage domain transition of the OUT signal 436 of the hot switching circuit 400 in view of a change in state of the IN signal 402. The IN signal 402 changes states from 0V to VPWR, for example. In an embodiment, the IN signal 402 may change states between voltages that are LV. Details regarding the change in state of the IN signal 402 are described herein with respect to FIG. 5. The transistors (M5) 422 and (M6) 424 are coupled to cascoded transistors 478. The source of the transistor (M11) 452 is coupled to the drain of the transistor (M12) 454, which are both coupled to the CLMPCNTRL signal 462. The hot switching circuit 400 further includes a dynamic bulk controller. The transistors (M13) 448, (M14) 450, and (M15) 480 when combined are referred to as a dynamic bulk controller 484. The dynamic bulk controller 484 ensures that an appropriate voltage is provided at the second node 403 and thus, the voltage may not always be the same (and is therefore not static). The dynamic bulk controller 484 ensures that a well (or a bulk) of transistor (M7) 430 is at the lowest voltage potential with respect to its drain and source during all modes of operation. When the input signal (i.e., the IN signal 402) is at VPWR, the CTRLB signal 408 is at 0V and the CTRL signal 414 is at VPWR. The INTHV signal 464 may be used to control the gate of the transistor (M7) 430 such that when the INTHV signal 464 is at VPWR, the INTHV signal 464 pulls a node carrying the GNDSW signal 444 to ground. At the same time, the INTHV signal 464 (coupled to the gate of the transistor (M15) 480) turns on the transistor (M15) 480 which pulls the second node 403 (also referred to as an internal bulk node) to ground (0V). When IN signal 402 is at ground (0V), the INTHV signal 464 eventually transitions to VNEG. The INTHV signal 464 turns off the transistor (M7) 430 and the internal bulk node 403 may be pulled to the same voltage potential as the node carrying the GNDSW signal 444. The transistor (M14) 450 turns on as the node carrying the GNDSW signal 444 is at a negative voltage potential.

In the depicted embodiment, the cascoded transistors 478 are high voltage cascoded transistors. In another embodiment, other transistors may be used.

In an embodiment, the biasing circuit 486 may be included within an NVM device or a non-memory device.

The transistors (M5) 422 and (M6) 424 in combination may be referred to as a latch. The transistors (M16) 470 and (M17) 472 in combination are referred to as a first inverter 468. The transistors (M18) 474 and (M19) 476 in combination are referred to as a second inverter 466.

In an embodiment, the transistors (M3) 412, (M4) 440, (M5) 422, (M6) 424, (M7) 430, (M9) 434, (M10) 462, (M11) 452, (M13) 448, (M14) 450, (M15) 480, (M17) 472, and (M19) 476 of the hot switching circuit 400 are NMOS transistors. The transistors (M1) 410, (M2) 416, (M8) 432, (M12) 454, (M16) 470, and (M18) 474 of the hot switching circuit 400 are PMOS transistors.

In the depicted hot switching circuit 400, no native NHV devices are used (for example, no native NHV devices or native NHV transistors such as the ones included in the NHV natives 346 in FIG. 3 are used). The transistors (M3) 412 and (M4) 440 may be thick oxide transistors which may be HV transistors that are used instead of native NHV transistors. In an embodiment, the transistors (M3) 412 and (M4) 440 may be other types of transistors other than HV. The transistors (M3) 412 and (M4) 440 are dynamically biased by the VHI signal 420. The voltage of the VHI signal 420 may change and is therefore dynamic. Therefore, the voltage of the VHI signal 420 may not always be the same (and is therefore not static). The VHI signal 420 may transition between VPWR and 0V in order to dynamically change the biasing of the biasing circuit 486 to provide over-voltage protection. The voltage of the VHI signal 420 changes with respect to the voltage of the VNEG signal 426, which is coupled to the gates of each of the transistors (M4) 440 and (M3) 412. In an embodiment, a voltage of the VHI signal 420 is a HV in response to the VNEG signal 426 transitioning between a HV and a LV, and the voltage of the VHI signal 420 is a LV in response to the VNEG signal 426 being at a HV. VNEG may also be referred to as an internal voltage supply.

The biasing circuit 486 may allow the hot switching circuit 400 to operate in various modes of operation. The hot switching circuit 400 may be in an active mode during initial power-up. The voltage of the VHI signal 420 is initially VPWR, the voltage of the CLAMP signal 548 is 0V and the voltage of the VNEG signal 426 is ramped from 0V to −3.0V. The hot switching circuit 400 may be in a standby mode/disable mode when the voltage of the VHI signal 420 is VPWR, the voltage of the CLAMP signal is 0V and the voltage of the VNEG signal 426 is 0V.

Standby Mode

When the hot switching circuit 400 is in a standby mode, the voltage of the IN signal 402 is at LV (e.g., in a range of 0V to VPWR). The negative voltage supply, which is the VNEG signal 426, is at ground (0V). The source of the transistor (M1) 410 is coupled to receive the CTRLB signal 408. The source of the transistor (M2) 416 is coupled to receive the CTRL signal 414. Depending on the state of the voltage of the IN signal 402, the voltage of the CTRLB signal 408 or the voltage of the CTRL signal 414 will be either at 0V or at VPWR (which is the voltage supplied to the sources of the transistors (M18) 474 and (M16) 470).

When the voltage of the IN signal 402 is VPWR, then the voltage of the CTRLB signal 408 is 0V and the voltage of the CTRL signal 414 is VPWR, as the CTRLB signal 408 and the CTRL signal 414 are outputs of back-to-back inverters connected in series (i.e., inverter 468 and inverter 466). An input of the inverter 468 is coupled to receive the IN signal 402. An input of the inverter 466 is coupled to receive an output of the inverter 468.

When the voltage of the IN signal 402 is ground (0V), then the voltage of the CTRLB signal 408 is VPWR and the voltage of the CTRL signal 414 is 0V. The voltage of the INTBHV signal 442 is VPWR. The voltages of the OUTB1 signal 418 and the OUT1 signal 428 are determined by the transistor (M3) 412 which provides a voltage of the OUTB1 signal 418 that is equal to the voltage at its gate (the voltage of the VHI signal 420) minus a threshold voltage ($V_g-V_{th}$). The voltage of the VHI signal 420 carried on the first node 401 is also VPWR, where the first node 401 is coupled to the gate of the transistor (M6) 424, because the VNEG signal 426 is at ground. The transistor (M6) 424 operates in the subthreshold region which forces the voltage of the OUT1 signal 428 to equal the voltage of the VNEG signal 426 (which in standby mode is 0V). The gate of the transistor (M4) 440 is also coupled to receive the VHI signal 420, which is set to VPWR. The voltage of the INTHV signal 464 will be driven to 0V. As the voltage of the OUTB1 signal 418 is at $V_g-V_{th}$ and the voltage of the INTHV signal 464 is 0V, the transistors (M7) 430 and (M8) 432 will be deactivated/turned off. The voltage of the OUT1 signal 428 may drive the gate of the transistor (M9) 434, however, this voltage may not be at a high enough potential to strongly drive an output as there may be substantial loading on the third node 405, which carries the OUT signal 436. Therefore, the transistors (M11) 452 and (M12) 454 are used to activate/turn on the transistor (M10) 462 by supplying the CLMPCNTRL signal 456 to the gate of the transistor (M10) 462. The CLMPCNTRL signal 456 (which is at VPWR) clamps the voltage of the OUT signal 436 to ground (0V). As the voltage of the CLMPCNTRL signal 456 remains at VPWR, the transistor (M12) 454 is activated/turned on while the transistor (M11) 452 remains in cutoff. This provides the voltage VPWR to the gate of the transistor (M10) 462 (which is coupled to receive the CLMPCNTRL signal 456).

The voltage of the CLAMP signal 548 is set to VPWR or a HV when the hot switching circuit 400 is in a standby mode. The transistors (M11) 452 and (M12) 454 may ensure that when the hot switching circuit 400 is off (e.g., deactivated, not in use, etc.), the OUT signal 436 is at ground and does not float. The CLAMP signal 458 may be at 1.2V which pulls the gate of the transistor (M10) 462 to 1.2V and pulls the OUT signal 436 to ground (0V). The transistor (M11) 452 may be used to force the hot switching circuit 400 to output a certain output signal. When hot switching occurs, the transistor (M11) may pull the OUT signal to VNEG.

In the depicted embodiment of FIG. 4, the OUT signal 436 will be 0V regardless of the voltage of the IN signal 402 when the hot switching circuit 400 is in standby mode.

Active Mode

When the hot switching circuit 400 first turns on (or is activated and is in an active mode), the IN signal 402 may or may not switch states. For example, the IN signal 402 may change states between 0V and VPWR or may not change states. If the IN signal 402 switches states and transitions from VPWR to 0V, the CLAMP signal 458 transitions states as well. The voltage of the CLAMP signal 458 transitions from VPWR to 0V and during the transition, the voltage supplied at the gate of the transistor (M10) 462 is not enough to turn the transistor (M10) 462 on. Therefore, the transistor (M10) 462 is inactive/turned off. The states of the CTRLB signal 408 and the CTRL signal 414 change which flips the voltage of the internal nodes of the latch (including the transistors (M5) 422 and (M6) 424). The voltage of the OUTB1 signal 418 becomes VNEG and the voltage of the OUT1 signal 428 becomes $V_g-V_{th}$. A short time after the voltages of the OUTB1 signal 418 and the OUT1 signal 428 change (i.e., flip), the VNEG signal 426 transitions from 0V to a negative voltage. In an embodiment, the negative voltage ranges from −2.4V to −3.6V. Once the voltage of the VNEG signal 426 reaches a certain voltage (e.g., −1.8V), the VHI signal 420 transitions from a high to low logic level (e.g., from VPWR to 0V) which pulls the INTBHV signal 442 to be the same as the OUTB1 signal 418 (the voltage of which is at VNEG). As the voltage of the VHI signal 420 is variable, it is referred to having a dynamic biasing control feature for controlling the cascoded transistors 478 (i.e., the cascoded transistors (M3) 412 and (M4)

440). Thus, in an embodiment, when VNEG is at its maximum negative voltage, no over-voltage stress issues affect the cascoded transistors 478.

The transistor (M6) 424 may be in cutoff mode (where current no longer flows through the transistor) as the voltage of the INTHV signal 464 is at VPWR and the VHI signal 420 is 0V. The transistor (M4) 440 is in a deep subthreshold and pulls the voltage of the OUT1 signal 428 to a $V_g-V_{th}$. In an embodiment, the voltage of the OUT1 signal 428 may be nominally at −0.75V. The voltage of the INTHV signal 464 is VPWR which turns on the transistor (M7) 430. As the voltage of the OUTB1 signal 418 is at VNEG, the transistor (M8) 432 is activated/turned on which keeps the OUT signal 436 at VGND or 0V.

The transistors (M13) 448, (M14) 450, and (M15) 480 may all be used in order to insure that a well (or a bulk) of transistor (M7) 430 is at the lowest voltage potential with respect to its drain and source during all modes of operation. The transistor (M15) 480 will be activated/turned on and pull the voltage of the BULK signal 460 to VGND (which is equal to the drain-to-source of the transistor (M7) 430). The BULK signal 460 is at a lowest voltage potential of the hot switching circuit 400.

When the hot switching circuit 400 is in an active mode and the IN signal 402 switches states from a first voltage to a second voltage (e.g., from VPWR to 0V), the CLAMP signal 458 transitions states as well. The VNEG signal 426 remains at a stable negative voltage (e.g., −1.8V) when the IN signal 402 changes states. The states of the CTRL signal 414 and CTRLB signal 408 flip and pull the voltage of the INTBHV signal 442 to VPWR and the voltage of the OUTB1 signal 418 to $V_g-V_{th}$. In an embodiment, the voltage of the OUTB1 signal 418 is −0.75V, nominally. The voltage of the OUTB1 signal and the voltage of the INTHV signal 464 transitions to VNEG. The transistor (M7) 430 is disabled/turned off. As the voltage of the OUTB1 signal 418 is approximately equal to −0.75V, the transistor (M9) 434 is activated/turned on which pulls the voltage of the OUT signal 436 to VNEG. The gate of the transistor (M8) 432 receives a voltage of −0.75V. The drain of the transistor (M8) 432 receives a voltage of VNEG (e.g., −2.4V to −3.6V) and source of the transistor (M8) 432 is floating. The transistor (M8) 432 is coupled to receive sufficient negative voltage on the source so that the transistor (M8) 432 is activated. In an embodiment, depending on the VNEG voltage, sufficient negative voltage may be between −1.5V to −0.5V (the sufficient negative voltage may also depend upon the overall process and temperature conditions). The dynamic bulk controller 484 may force the well (or the bulk) of transistor (M7) 430 to be coupled to the GNDSW signal 444, which is also coupled to the source of transistor (M8) 432.

By using the dynamic bulk controller 484 and the dynamic biasing control feature for controlling the cascoded transistors 478, the hot switching circuit 400 does not utilize native devices to activate/turn-on transistors (M8) and (M9). The dynamic bulk controller 484 ensures that no forward bias conditions exist for all modes. The dynamic bulk controller 484 may ensure that the well (or the bulk) of the transistor (M7) 430 is at a most negative voltage to prevent forward biasing problems. By using the dynamic bulk controller, the BULK signal 460 carried on the second node 403 is at a lowest potential between ground and a node carrying the GNDSW signal 444.

In an embodiment if the dynamic bulk controller 484 was removed and the well (or the bulk) of transistor (M7) 430 was instead coupled to the VGND signal 406, then a forward bias condition may exist. A forward biasing condition may occur when the bulk is at a higher potential than a drain or a source of a transistor. For example, if the drain to bulk voltage is more negative than the bulk itself, a forward biasing condition may exist in which too much current (increased diffusion current) is generated. Forward biasing may cause a potential latchup condition.

If the hot switching circuit 400 (either initially or after being in an active mode) is disabled or put in standby mode, the VNEG signal 426 transitions toward 0V and the VHI signal 420 transitions from 0V to VPWR when the VNEG signal 426 reaches −1.8V. The VHI signal 420 and the CLAMP signal 458 transitions to VPWR and clamp the output signal OUT 436 to 0V. As described above with respect to the standby mode, the OUT signal 436 is clamped to 0V regardless of the state of the IN signal 402.

In an embodiment, VPWR has an approximate voltage of 1.2V. In an active mode, when the VNEG signal 426 transitions to HV from ground, the VHI signal 420 remains at 1.2V and thus remains high until the VNEG signal 426 reaches a particular threshold HV (e.g., −1.8V). Prior to the VNEG signal 426 transitioning to HV, the VHI signal 420 remains high (e.g., VPWR) and one of the transistors, transistor (M3) 412 or transistor (M4) 440, is activated as long as the VHI signal 420 is high (i.e., at or above 0V). If the transistor (M3) 412 is activated, then the voltage of the OUTB1 signal 418 begins to rise because the INTBHV signal 442 is high and the VHI signal 420 is high. If instead the transistor (M4) 440 is activated, then the voltage of the OUT1 signal 428 will begin to rise because the INTHV signal 464 is high and the VHI signal 420 is high. The voltage of the OUT1 signal 428 begins to rise until the VNEG signal 426 reaches a certain negative threshold voltage. The VHI signal 420 transitions to ground (0V) in order to meet the transistors' (M3) 412 and (M4) 440 as well as the transistors' (M5) 422 and (M6) 424 SOA requirements.

The dynamic biasing of the VHI signal 420 allows for the hot switching circuit 400 to meet SOA requirements. If the VHI signal 420 was instead static, SOA requirements may not be met. For example, suppose that the VNEG signal 426 is −3V and the VHI signal 420 is high (e.g., 1.0 V). If the VHI signal 420 does not change and remains static, the transistors (M3) 412, (M4) 440, (M5) 422 and (M6) 424 may become overstressed from having a drain-to-source voltage differential of 4V.

By using dynamic biasing, SOA requirements are met in any hot switching mode (standby or active). In standby mode, when the VNEG signal 426 reaches an approximate voltage around −2V, the VHI signal 420 will transition from 1.2V to ground (0V). The voltage of the VHI signal 420, during the transition, is high enough to keep the transistor (M4) 440 activated. Therefore, the OUT1 signal 428 is at voltage that is high enough to flip a state of the transistors (M5) 422 and (M6) 424. One of the voltages of the OUT1 signal 428 or OUTB1 signal 418 is at VNEG. If, for example, the voltage of the OUT1 signal 428 is HV, then the voltage of OUT1B signal 418 may be VNEG (e.g., −3V). The transistors (M7) 430, (M8) 432, and (M9) 434 may be activated/turned on because the voltage of the INTHV signal 464 is at 1.2V. The gate of the transistor (M8) 432 is coupled to receive the OUT1B signal 418 (having a voltage of −3V) the transistor (M8) 432 may also be on/activated. Therefore, the OUT signal 436 is brought to ground (0V).

If the voltage of the INTHV signal 464 is low and the voltage of the INTBHV signal 442 is high, the voltage of the OUT1 signal 436 will be high (at −3V) and the voltage of the OUTB1 signal 418 will be ground (0V). The drain of the transistor (M9) 434 may pull the OUT signal 436 to negative.

If the voltage of the INTHV signal 464 is instead low and the voltage of the INTBHV signal 442 is high, the voltage of the OUT1 signal 428 will be high (at −3V) and the voltage of the OUTB1 signal 418 will be ground (0V). The drain of the transistor (M9) 434 may pull the OUT signal 436 to negative.

By using the dynamic biasing control feature for controlling the cascoded transistors 478, the hot switching circuit 400 does not utilize native devices to turn on/activate the transistors (M8) 432 and (M9) 434.

In an embodiment, a hot switching circuit may be utilized by NVM devices. A hot switching circuit may be utilized by devices other than memory devices. For example, a hot switching circuit may be utilized by any device requiring an output voltage signal to transition between different power domain levels without ramping an internal voltage supply signal by changing an input state of the hot switching circuit.

Figure 5:
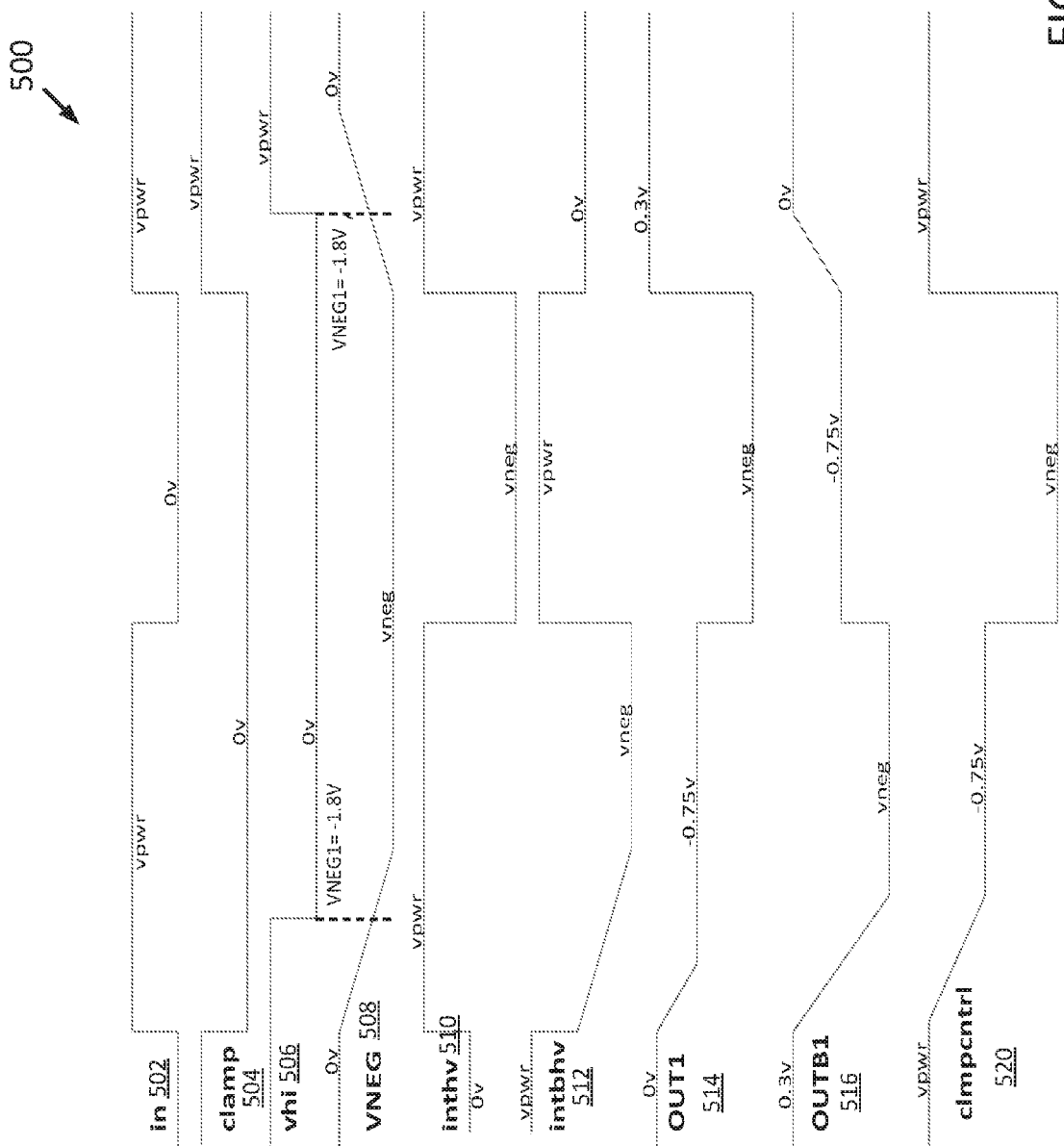
FIG. 5 is a timing diagram, according to an embodiment.

Details regarding the timing information pertaining to various input signals for various modes of operation are described herein with respect to FIG. 5.

FIG. 5 is a timing diagram 500, according to an embodiment. The timing diagram 500 depicts the timing of various signals shown in FIG. 4. In an embodiment, the timing diagram 500 depicts the timing of various signals during an active mode, as described above. The timing diagram 500 depicts a timing diagram of an IN signal 502, a timing diagram of a CLAMP signal 504, a timing diagram of a VHI signal 506, a timing diagram of a VNEG signal 508, a timing diagram of an INTHV signal 510, a timing diagram of an INTBHV signal 512, a timing diagram of a OUT1 signal 514, a timing diagram of a OUTB1 signal 516, and a timing diagram of a CLMPCNTRL signal 520.

The timing diagrams of the IN signal 502, the CLAMP signal 504, the VHI signal 506, the VNEG signal 508, the INTHV signal 510, the INTBHV signal 512, the OUT1 signal 514, the OUTB1 signal 516, and the CLMPCNTRL signal 520 correspond to the IN signal 402, the CLAMP signal 458, the VHI signal 420, the VNEG signal 426, the INTHV signal 464, the INTBHV signal 442, the OUT1 signal 428, the OUTB1 signal 418, and the CLMPCNTRL signal 456 in FIG. 4, respectively.

In FIG. 5, the y-axis of the timing diagrams depict voltage levels.

The timing diagram of the IN signal 502 depicts a signal starting out at 0V, rising to VPWR, then dropping again to 0V, and rising again to VPWR.

The timing diagram of the CLAMP signal 504 depicts a signal starting out at VPWR, dropping to 0V, then rising again to VPWR. Referring now to FIG. 4, the CLAMP signal 458 is at VPWR when the IN signal 402 is at 0V. When the IN signal 402 transitions from 0V to VPWR, the CLAMP signal 458 changes states. For example, when the IN signal 402 changes states from 0V to VPWR, the CLAMP signal 504 changes states between VPWR and 0V.

The timing diagram of the VNEG signal 508 depicts a signal starting out at 0V, falling gradually to VNEG (e.g., −3V), then rising gradually again to 0V. The VNEG signal 508 reaches a voltage VNEG1=−1.8 v when the VHI signal in the timing diagram of the VHI signal 506 transitions between VPWR and 0V. Referring now to FIG. 4, when the VNEG signal 426 transitions between 0V and VNEG, the VHI signal 420 transitions between VPWR and 0V, the VNEG signal 426. The VNEG signal reaches the VNEG1 voltage two times. The voltage of the VHI signal 506 changes in view of the voltage of the VNEG signal 508. The VHI signal 506 is a LV (VPWR) in response to the VNEG signal 508 transitioning between a HV (VNEG) and a LV (0V), and the voltage of the VHI signal 506 is a LV (0V) in response to the VNEG signal 508 being at a HV (VNEG).

The timing diagram of the INTHV signal 510 depicts a signal starting out at 0V, then rising to VPWR, then dropping to VNEG and rising again to VPWR. Referring now to FIG. 4, when the IN signal 402 changes states between 0V and VPWR, the INTHV signal 464 changes states (from 0V to VPWR, from VPWR to VNEG, and from VNEG to VPWR).

The timing diagram of the INTBHV signal 512 depicts a signal starting out at VPWR, then gradually dropping to VNEG and remaining at VNEG for a period of time, then rising again to VPWR, and then dropping to 0V. The INTBHV signal transitions to VNEG similar to the transition of the VNEG signal in the timing diagram of the VNEG signal 508. Referring now to FIG. 4, when the IN signal 402 changes states between 0V and VPWR, the INTBHV signal 442 changes states (from 0V to VNEG, from VNEG to VPWR, and from VPWR to 0V).

The timing diagram of the OUT1 signal 510 depicts a signal starting out at 0V, then gradually dropping to −0.75V (where the drop occurs substantially at the same time as the INTHV signal transitions from 0V to VPWR), then dropping to VNEG, and then rising to 0.3V. Referring now to FIG. 4, when the IN signal 402 changes states between 0V and VPWR, the OUT1 signal 428 changes states (from 0V to −0.75V, from −0.75V to VNEG, and from VNEG to VPWR).

The timing diagram of the OUTB1 signal 510 depicts a signal starting out at 0.3V, then gradually dropping to VNEG (where the drop occurs substantially at the same time as the INTBHV signal transitions from VPWR to VNEG), then rising to −0.75V, and then gradually rising to 0V. Referring now to FIG. 4, when the IN signal 402 changes states between 0V and VPWR, the OUTB1 signal 418 changes states (from 0.3V to VNEG, from VNEG to −0.75V, and from −0.75V to 0V).

The timing diagram of the CLMCNTRL signal 520 depicts a signal starting out at VPWR, then gradually dropping to −0.75V, then dropping again to VNEG, and rising to VPWR. VPWR, 0V, 0.3V, −0.75V may be LV and VNEG may be HV. Referring now to FIG. 4, when the IN signal 402 changes states between 0V and VPWR, the CLMPCNTRL signal 456 changes states (from VPWR to −0.75V, from −0.75V to VNEG, and from VNEG to VPWR).

As described above with respect to FIG. 4, when the IN signal 402 transitions from 0V to VPWR, the out signal OUT 436 is at 0V. Referring now to FIG. 5, the timing diagram of the IN signal 502 depicts that an IN signal changes states from 0V to VPWR two times. Starting from the left of the timing diagram of the IN signal 502, when the IN signal first changes states from 0V to VPWR, the CLAMP signal changes states from VPWR to 0V. The OUT1 signal changes states from 0V gradually to −0.75V. The OUTB1 transitions from 0.3V gradually to VNEG (which is HV). The CLMPCNTRL signal changes states from VPWR to −0.75V. The VNEG signal gradually transitions from 0V (which is LV) to VNEG (which is HV). The INTHV signal changes states from 0V to VPWR. The INTBHV signal transitions from VPWR gradually to VNEG. The second time the IN signal changes states from 0V to VPWR, the CLAMP signal changes states from 0V to VPWR. The OUT1 signal transitions from VNEG to 0.3V. The OUTB1 signal changes states from −0.75V gradually to 0V. The CLMPCNTRL signal transitions from VNEG to VPWR. The VNEG signal transitions from VNEG gradually to 0V. The INTHV signal transitions from VNEG to VPWR. The INTBHV signal transitions from VPWR to 0V.

As described above with respect to FIG. 4, when the IN signal 402 transitions from VPWR to 0V, the out signal OUT 436 is at VNEG. Referring now to FIG. 5, when the IN signal changes states from VPWR to 0V, the CLAMP signal, the VHI signal, and the VNEG signal do not change states. The INTHV signal transitions from 0V to VPWR to VNEG and back to VPWR. The OUT1 signal transitions from 0V to −0.75V to VNEG to 0.3V. The CLMPCNTRL signal transition from VPWR to −0.75V to VNEG to VPWR. The INTBHV signal transitions from VPWR to VNEG to VPWR to 0V. The OUT1B signal transition from 0.3V to VNEG to −0.75V to 0V.

In the depicted embodiment of FIG. 4, an input signal (IN signal 402) is received at an input node (i.e., the fourth node 407) at an input of the hot switching circuit 400.

A biasing signal (i.e., VHI signal 420) is generated at a first node 401. The first node 401 is coupled to cascoded high voltage transistors 478. The biasing signal is configured to change a voltage level of at least one transistor of the cascoded transistors 478 to allow voltage domain transition of an output signal of the circuit in view of a change in state of the input signal (i.e., IN signal 402). Referring to FIG. 4, the biasing signal, which is generated by the biasing circuit 486, is generated at the first node 401. The biasing signal is configured to change a voltage level of the transistors (M3) 338 and (M4) 340 of the cascoded transistors 478 at the first node 401 to allow voltage domain transition of the OUT signal 436 in view of a change in state of the IN signal 402.

The output signal is output without ramping a supply signal of the circuit. Referring to FIG. 4, the OUT signal 436 is output without ramping the VNEG signal 426 of the hot switching circuit 400. The VNEG signal 426 therefore is kept stable. For example, the VNEG signal 426 is kept at −3.0V while the OUT signal 436 changes between 0V and HV (e.g., VNEG). As the VNEG signal 426 is stable, the VNEG signal 426 is not brought down to 0V and then ramped up to −3.0V while the OUT signal 426 undergoes voltage domain transition.

The biasing circuit 486 of the hot switching circuit 400 in FIG. 4 may be coupled to a non-volatile (NVM) memory cell when implemented within a memory device. As described above, the biasing circuit 486 includes cascoded transistors 478 and a voltage control circuit 490 which is coupled to the high voltage transistors 478. The hot switching circuit 400 also includes dynamic bulk controller 484 and an output node coupled to the output of the hot switching circuit 400, all of which may be housed within the memory device.

FIG. 6 is a flow diagram of a biasing signal used in a hot switching circuit, according to an embodiment. Method 600 may be performed by the circuit 400 in FIG. 4, or the circuit 400 may perform some or all of the operations described herein.

Method 600 begins at block 610, where an input signal is received at an input node of a circuit. Referring to FIG. 4, the IN signal 402 is received at the fourth node 407.

Method 600 continues to block 620, where, in response to the input signal transitioning between a LV and ground (0V), a first signal (CTRLB) coupled to a first transistor is generated and a second signal (CRTL) coupled to a second transistor is generated. Referring to FIG. 4, the CTRLB signal 408 coupled to the transistor (M1) 410 is generated in response to the IN signal 402 changing states (e.g., between VPWR and ground (0V)). The CTRL signal 414 coupled to the transistor (M2) 416 is also generated in response to the IN signal 402 changing states.

In an embodiment, the inverter 468 generates the CTRLB signal 408 in view of the IN signal 402. The inverter 466 generates the CTRL signal 414 in view of the IN signal 402.

Method 600 continues to block 630, where a biasing signal is generated. A voltage of the biasing signal is a LV (0V or VPWR) in response to a supply signal of the circuit transitioning between a HV and a LV. The voltage of the biasing signal is also a LV in response to the supply signal of the circuit being at a HV. Referring to FIG. 4, the biasing signal (i.e., the VHI signal 420) is generated by the biasing circuit 486. A voltage of the biasing signal is a LV in response to a supply signal (i.e., the VNEG signal 426) of the hot switching circuit 400 transitioning between a HV and a LV. The voltage of the biasing signal is also a LV in response to the supply signal being at a HV.

Method 600 continues to block 640, where a biasing signal is applied to at a first node. Referring to FIG. 4, the biasing signal (i.e, the VHI signal 420) is applied to a first node 401. The first node 401 is coupled to the gate of the transistor (M3) 412 and the gate of the transistor (M4) 430.

Method 600 continues to block 650, where a voltage level of at least one of the first transistor or the second transistor is adjusted to allow voltage domain transition of an output signal in view of a change in state of the input signal. Referring to FIG. 4, a voltage level of at least one of the (M3) 420 or (M4) 430 is adjusted to allow voltage domain transition of the OUT signal 436 in view of a change in state of the IN signal 402.

Method 600 continues to block 660, where the output signal is output without ramping the supply of the circuit. Referring to FIG. 4, the OUT signal 436 is output without ramping the VNEG signal 426 of the hot switching circuit 400. Method 600 then ends.

In an embodiment, the BULK signal 460 is provided to the well of the transistor (M7) 430. The BULK signal 460 is configured to be at a lowest voltage potential of the hot switching circuit 400 (at the drain and source of the transistor (M7) 430).

As described above, when the hot switching circuit 400 is in a standby mode, a voltage on the output signal (i.e., OUT signal 436) is output at 0V in response to a voltage of the biasing signal (i.e., VHI signal 420) being at a first voltage (i.e., VPWR).

When the hot switching circuit 400 is in an active mode, a voltage on the output signal (i.e., OUT signal 436) is output at a second voltage (i.e., VNEG) in response to a change in state of the IN signal 402 (i.e., when the IN signal 402 changes states from VPWR to 0V).

When the hot switching circuit 400 is in an active mode, a voltage on the output signal (i.e., OUT signal 436) is output at 0V in response to a change in state of the IN signal 402 (i.e., when the IN signal 402 changes states from 0V to VPWR).

Embodiments of the present patent document include various operations described herein. These operations may be performed by hardware components, software, firmware, or a combination thereof.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. The terms "first," "second," "third," "fourth," etc. as used herein are meant as labels to distinguish among different elements and may not necessarily have an ordinal meaning according to their numerical designation.

The above description sets forth numerous specific details such as examples of specific systems, components, methods, and so forth, in order to provide an understanding of several embodiments of the present patent document. It may be apparent to one skilled in the art, however, that at least some embodiments of the present patent document may be practiced without these specific details. In other instances, well-known components or methods are not described in detail or are presented in simple block diagram format in order to avoid unnecessarily obscuring the present patent document. Thus, the specific details set forth are merely exemplary. Particular implementations may vary from these exemplary details and still be contemplated to be within the scope of the present patent document.

What is claimed is:

1. A circuit comprising:
    a plurality of cascoded transistors comprising a first transistor and a second transistor, wherein a first gate of the first transistor is coupled to a second gate of the second transistor at a first node;
    a voltage control circuit coupled to at least one of the plurality of cascoded transistors, wherein the voltage control circuit is configured to change a supply voltage level at a terminal of at least one of the plurality of cascoded transistors to allow voltage domain transition of an output signal configured to be coupled to an output of the voltage control circuit in view of a change in state of a first signal input to the circuit without ramping a supply signal of the circuit; and
    a bulk controller coupled to the voltage control circuit view a second node, the bulk controller configured to output a bulk signal via the second node.

2. The circuit of claim 1, further comprising:
    a third transistor comprising a third gate, a well, a source, and a drain, wherein the well of the third transistor is coupled to the second node, and wherein the well is configured to receive the bulk signal via the second node;
    a third node configured to output the output signal; and
    a first inverter coupled to a fourth node, the fourth node configured to receive, at an input of the first inverter, the input signal.

3. The circuit of claim 2, wherein the voltage control circuit further comprises:
    cross-coupled transistors coupled to the plurality of cascoded transistors;
    a fourth transistor comprising a fourth gate, a well, a source, and a drain; and
    a fifth transistor comprising a fifth gate, a well, a source, and a drain, wherein the source of the fourth transistor is coupled to the drain of the fifth transistor.

4. The circuit of claim 2, wherein in a standby mode, a voltage of a biasing signal carried on the first node is a first voltage (VPWR) and a voltage of the output signal carried on the third node is zero volts.

5. The circuit of claim 4, wherein in an active mode, the input signal transitions between a low voltage (LV) and ground (0V), and a voltage of the output signal carried on the third node is one of: a second voltage (VNEG) or zero volts.

6. The circuit of claim 1, wherein the plurality of cascoded transistors and the voltage control circuit are disposed within a non-volatile memory device.

7. The circuit of claim 1, wherein the plurality of cascoded transistors comprise a plurality of cascoded high voltage transistors, and wherein the circuit further comprises a negative high voltage level shifter not including native transistors.

8. The circuit of claim 1, wherein the second node outputs the bulk signal at a lowest voltage potential of the circuit.

9. The circuit of claim 1, further comprising:
    a first inverter, wherein an input of the first inverter is coupled to receive the input signal; and
    a second inverter, wherein an input of the second inverter is coupled to receive an output of the first inverter.

10. The circuit of claim 1, wherein the voltage control circuit is configured to change the supply voltage level while maintaining a safe operating area.

11. An apparatus comprising:
    a non-volatile memory (NVM) cell;
    a biasing circuit coupled to the NVM cell, the biasing circuit comprising:
        a plurality of cascoded transistors comprising a first transistor and a second transistor, wherein a first gate of the first transistor is coupled to a second gate of the second transistor at a first node; and
        a voltage control circuit coupled to at least one of the plurality of cascoded transistors, wherein the voltage control circuit is configured to control a supply voltage level at a terminal of at least one of the plurality of cascoded transistors and to allow voltage domain transition of an output signal in view of a change in state of a first signal input to the biasing circuit;
    a bulk controller coupled to the voltage control circuit via a second node, the bulk controller configured to output a bulk signal via the second node, wherein the second node is configured to output the bulk signal at a lowest voltage potential of the apparatus; and
    a third node configured to output the output signal.

12. The apparatus of claim 11, further comprising an inverter coupled to a fourth node, the fourth node configured to receive, at an input of the inverter, the input signal.

13. The apparatus of claim 11, further comprising a third transistor comprising a third gate, a well, a source, and a drain, wherein the well of the third transistor is coupled to the second node, and wherein the well is configured to receive the bulk signal via the second node.

14. The apparatus of claim 11, wherein when the apparatus is in a standby mode, a voltage of a biasing signal carried on the first node is a first voltage (VPWR) and a voltage of the output signal carried on the third node is zero volts.

15. The apparatus of claim 14, wherein when the apparatus is in an active mode and the input signal transitions between a low voltage (LV) and ground (0V), a voltage of the output signal carried on the third node is one of: a second voltage (VNEG) or zero volts.

16. A method comprising:
    receiving, at an input node of a circuit, an input signal;
    generating a biasing signal at a first node, wherein the first node is coupled to a plurality of cascoded high voltage transistors, wherein the biasing signal is configured to adjust a supply voltage level at a terminal of at least one of the plurality of cascoded high voltage transistors to allow voltage domain transition of an output signal of the circuit in view of a change in state of the input signal; and
    outputting the output signal while keeping a supply signal of the circuit stable, wherein the generating the biasing signal further comprises:
generating a voltage of the biasing signal at a first low voltage (LV) in response to the supply signal of the circuit transitioning between a high voltage (HV) and a second LV; and
applying the biasing signal to the first node;
wherein in response to the input signal transitioning between a third LV and ground (0V), generating a first signal (CTRLB) and coupling the CTRLB to a first transistor of the plurality of cascoded high voltage transistors, and generating a second signal (CTRL) and coupling the CTRL to a second transistor of the plurality of cascoded high voltage transistors, wherein a first gate of the first transistor is coupled to a second gate of the second transistor at the first node.

17. The method of claim 16, further comprising, in an active mode, in response to the input signal transitioning between a first voltage (VPWR) and ground (0V), outputting a voltage of the output signal at one of a second voltage (VNEG) or zero volts.

18. The method of claim 16, further comprising, in a standby mode, outputting a voltage of the output signal at zero volts in response to a voltage of the biasing signal being at a first voltage (VPWR).

* * * * *